United States Patent [19]

Kapral

[11] Patent Number: 4,468,654

[45] Date of Patent: Aug. 28, 1984

[54] CHARGE REDISTRIBUTION A-LAW PCM DECODER

[75] Inventor: Christopher W. Kapral, Belmont, Calif.

[73] Assignee: GTE Network Systems Incorporated, Phoenix, Ariz.

[21] Appl. No.: 558,567

[22] Filed: Dec. 5, 1983

Related U.S. Application Data

[63] Continuation-in-part of Ser. No. 307,821, Oct. 2, 1981.

[51] Int. Cl.$^3$ .............................................. H03K 13/02
[52] U.S. Cl. ......................... 340/347 DA; 340/347 M
[58] Field of Search ............... 340/347 DA, 347 AD, 340/347 M, 347 C, 347 CC; 370/7; 375/26–30

[56] References Cited

U.S. PATENT DOCUMENTS 3,541,446  9/1968  Prozeller ..................... 340/347 AD

OTHER PUBLICATIONS

Tsividis et al., A Segmented U-255 Law PCM Voice Encoder-, IEEE Journal of Solid-State Circuits, V. SC-11, No. 6, 12/1976, pp. 740-747.
Caves et al., A PCM Voice Codec with On-Chip Filters, IEEE Journal of Solid-State Circuits, vol. SC-14, No. 1, 2/1979, pp. 65-73.
Haque et al., A Two Chip PCM Voice Codec with Filters, IEEE Journal of Solid-State Circuits, vol. SC-14, No. 6, 12/1979, pp. 961-969.

*Primary Examiner*—T. J. Sloyan
*Attorney, Agent, or Firm*—Russell A. Cannon

[57] ABSTRACT

An integratable PCM decoder that is relatively insensitive to parasitic and stray capacitance effects and that requires a total capacitance of only 32 times the normalized capacitance Co of the smallest capacitor thereof. The decoder comprises a source of positive and negative reference voltages; a differential input operational amplifier having its non-inverting input connected to ground; a storage capacitor $CO = 16Co$ connected as a feedback capacitor between the inverting input and the output terminals of the amplifier so that they operate as a voltage source; binary weighted capacitors $C1 = Co$, $C2 = 2Co$, $C3 = 4Co$ and $C4 = 8Co$; and a second unit weighted capacitor $C5 = Co$. In an a-law decoder, switch means alternately connects one and other sides of ones of C1-C5 (1) between ground and either a±reference voltage or ground, in accordance with characterizations in a PCM coded digital input word for sampling charge, and (2) between one side of CO and ground for transferring charge to CO for the first segment associated with a PCM word, and across CO for redistributing charge on the capacitors for other segments of a designated polarity. In a mu-law decoder, the switch means alternately connects one and other sides of ones of C1-C5 (1) between ground and either a±reference voltage or ground, in accordance with the characterizations in a PCM coded digital input word, and (2) across the storage capacitor CO for redistributing charge on the capacitors for each segment of a designated polarity. The resultant analog signal established on CO in the eighth segment is sampled prior to resetting the charge voltage on CO to substantially zero volts and receipt of the next PCM input word.

51 Claims, 13 Drawing Figures

(A LAW DECODER 10")

(MU-LAW DECODER 10)

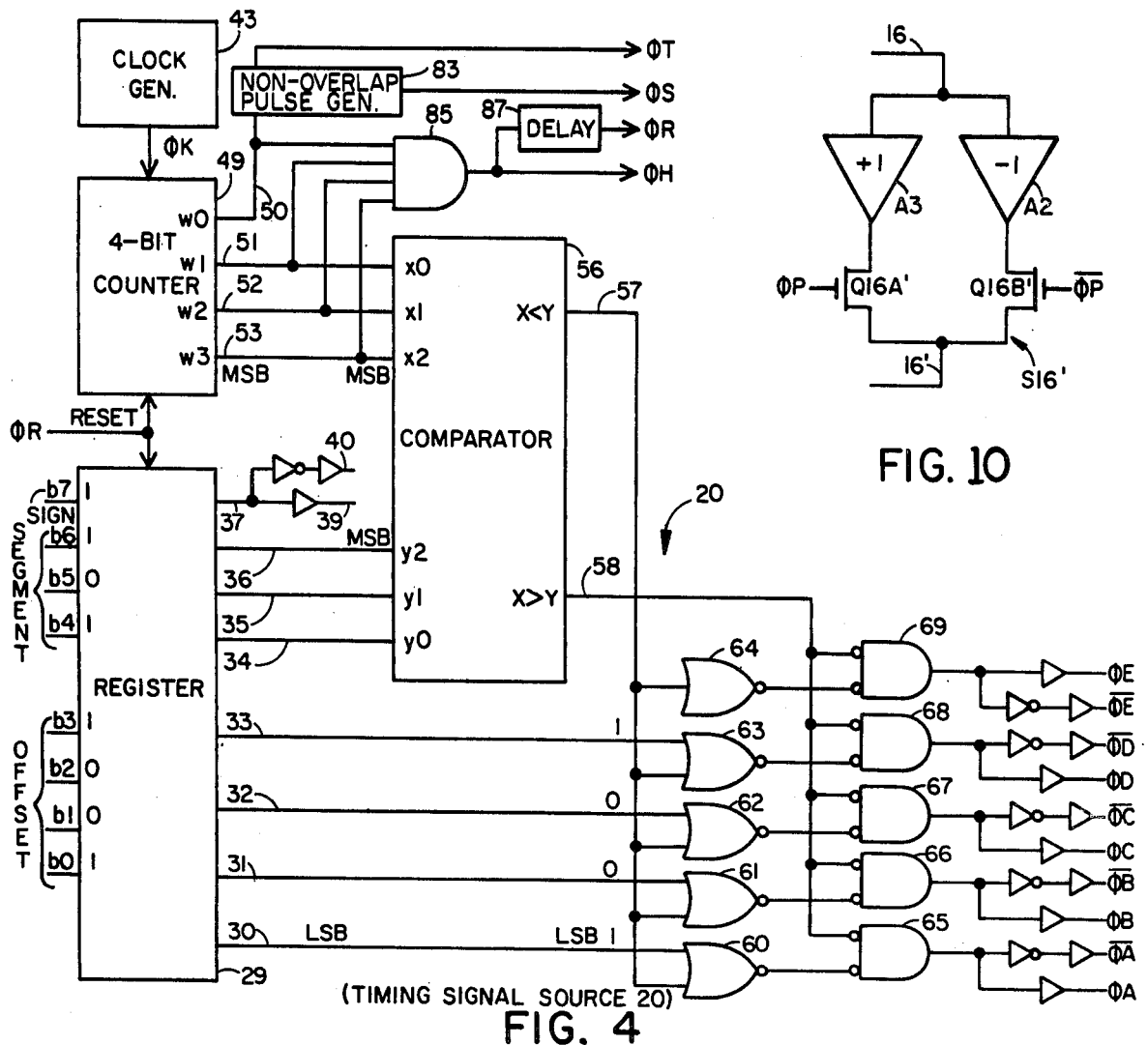
FIG. 4
FIG. 10
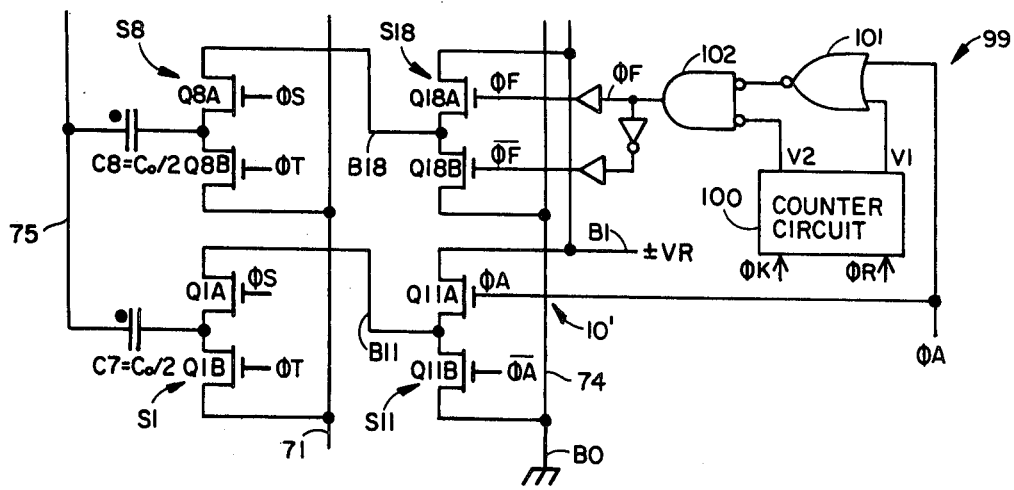
FIG. 7

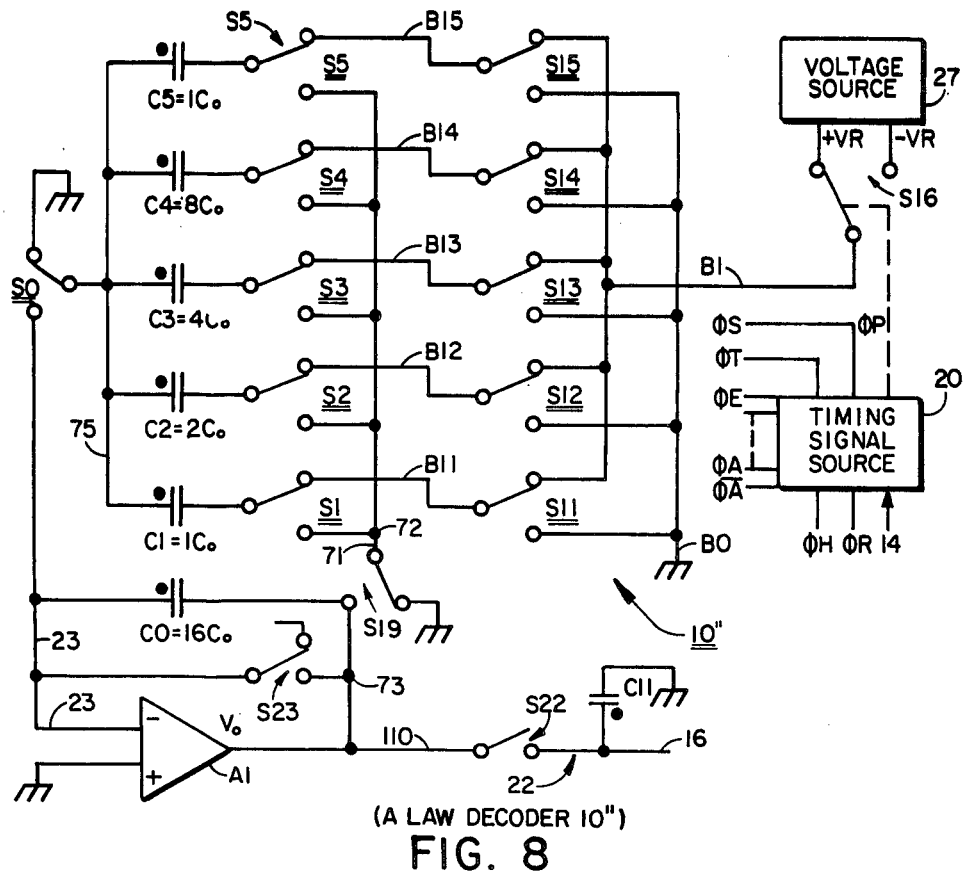
FIG. 8 (A LAW DECODER 10″)
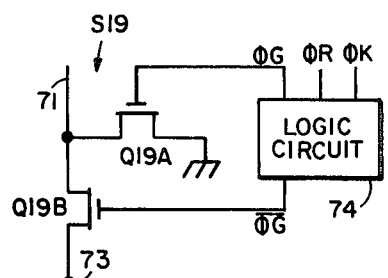
FIG. 9
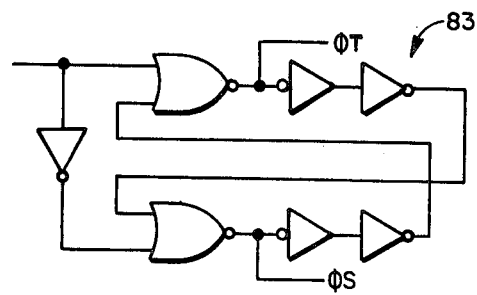
FIG. 6

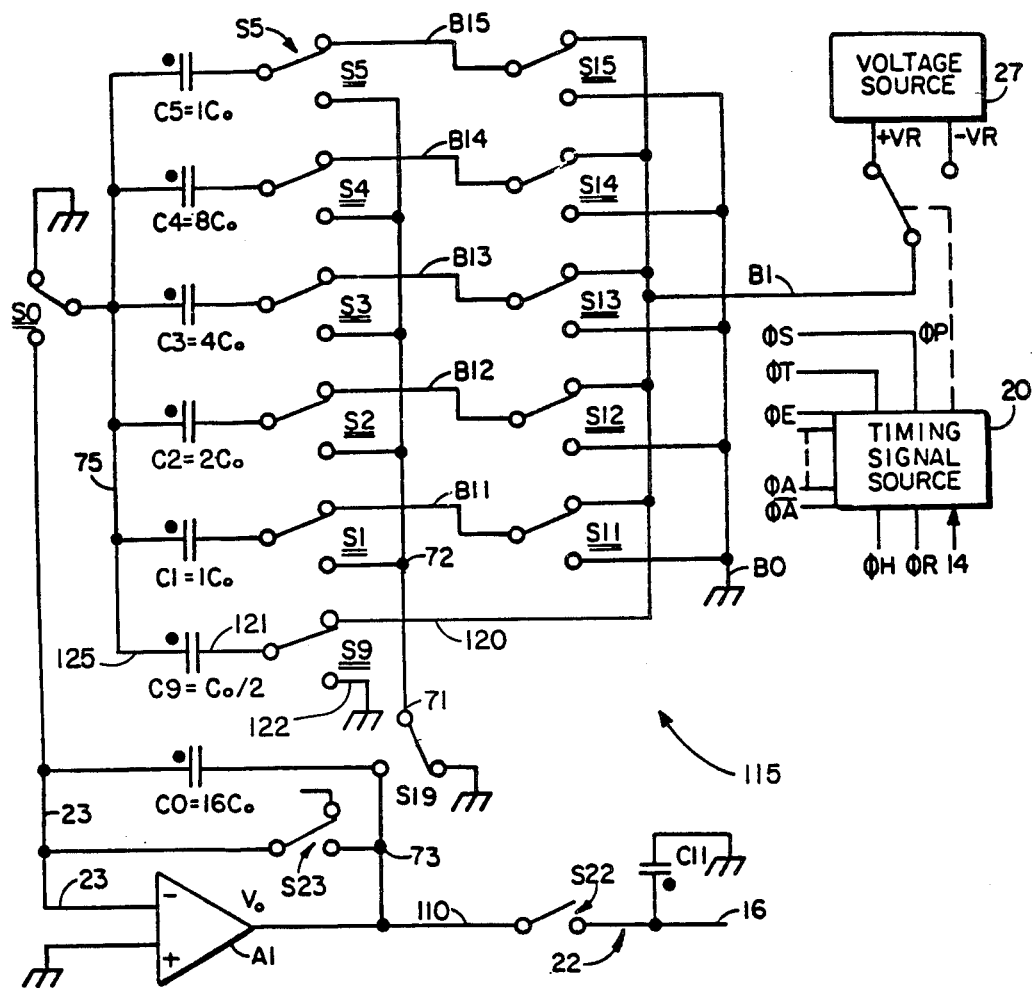

(A-LAW DECODER 115)

FIG. 12

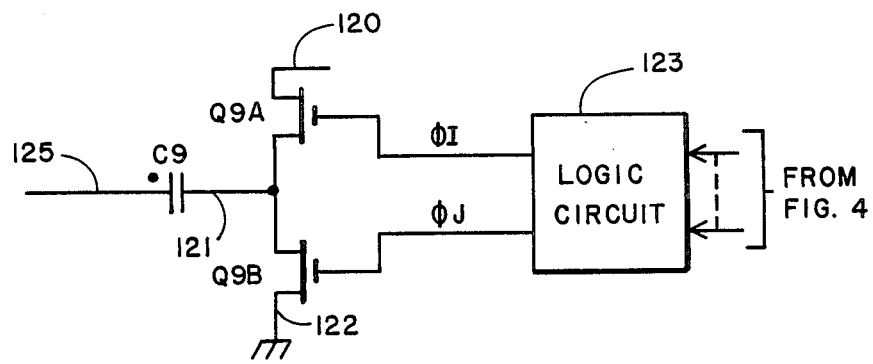

$\phi I = (\overline{\phi 58} \cdot \overline{\phi 57} \cdot \overline{\phi G} \cdot \phi S) + (\overline{b6} \cdot \overline{b5} \cdot \overline{b4} \cdot w1 \cdot \overline{w2} \cdot \overline{w3} \cdot \phi S)$ $\phi J = \phi 57 + \phi 58 + (\overline{\phi 58} \cdot \overline{\phi 57} \cdot \overline{\phi G} \cdot \phi T) + (\overline{b6} \cdot \overline{b5} \cdot \overline{b4} \cdot w1 \cdot \overline{w2} \cdot \overline{w3} \cdot \phi T)$

FIG. 13

CHARGE REDISTRIBUTION A-LAW PCM DECODER

RELATED APPLICATION

This is a continuation-in-part of Ser. No. 307,821, filed Oct. 2, 1981.

BACKGROUND OF INVENTION

This invention relates to method and apparatus for decoding PCM digital input words and more particularly to an integrated PCM decoder with reduced capacitor area and that is substantially insensitive to parasitic and stray capacitance effects.

PCM encoders and/or decoders are described in the articles "A Two-Chip PCM Voice Codec With Filters" by Y. A. Hakque, et al., IEEE Journal of Solid State Circuits, Vol. SC-14, No. 6, pages 961–969, December 1979; "A PCM Voice Codec With On-Chip Filters" by J. T. Caves, et al., IEEE Journal of Solid State Circuits, Vol. SC-14, No. 1, pages 65–73, February 1979; and "A Segmented Mu-255 Law PCM Voice Encoder Utilizing NMOS Technology" by Paul R. Gray, et al., IEEE Journal of Solid State Circuits, Vol. SC-11, No. 6, pages 740–747, December 1976, which are incorporated herein by reference. Mu-law decoders operating on 8-bit PCM code words have employed arrays of binary weighted capacitors, the total array capacitance typically being 255 times the capacitance of the smallest capacitance of the array. The capacitances of the two largest binary weighted capacitors of the array are therefore 128 and 64 times that of the smallest capacitor thereof. In integrated circuit structures, however, it is desirable to minimize the surface area of a chip that is required for individual circuit elements, especially where a codec (coder-decoder) and associated circuits such as filters are fabricated on the same chip. It is readily seen that the chip area dedicated for integrated capacitors in such an integrated decoder may be reduced by approximately 50% by deleting only one of the binary weighted capacitors. Also, many of the previously available PCM decoders of integrated circuit design are sensitive to parasitic and stray capacitance effects associated with plates of integrated capacitors and switches thereof.

An object of this invention is the provision of an improved PCM decoder.

SUMMARY OF INVENTION

In accordance with this invention, an A-law decoder for converting PCM coded digital input words into associated analog signal samples; each input word including first, second, and third code groups of one or more bits defining the polarity, segment, and step offset in a prescribed segment for an associated analog signal sample; comprises: first capacitor means $C1=mCo$, where m is an integer and Co is a normalized unit capacitance; second capacitor means $C2=nmCo$, that is an integral multiple of the principal number n of steps within each segment; third capacitor means having a total-net normalized capacitance which is substantially $Cs=nmCo\text{-}mCo=(n\text{-}1)mCo$; first switch means responsive to the first code group for impressing a positive or negative reference voltage on a first bus line; operational amplifier means having a virtually grounded input terminal and an output terminal thereof connected to said one and other sides of C2; second switch means selectively operative for electrically connecting a second bus line to either ground or the other side of C2; and third switch means responsive to the second and third code groups (a) for cyclically connecting said one and other sides of said first and third capacitor means to ground and said first bus line, respectively, for charging the associated capacitances with one of the positive and negative reference voltages, and connecting said one and other sides of said first and third capacitor means simultaneously to said one side of said second capacitor means and said second bus line, respectively, for stabilizing charge on said capacitances a number of times (which may be zero) associated with a segment that is designated by the second code group; (b) for subsequently first connecting said one and other sides of said first and third capacitor means to ground and one of said first bus line and ground, respectively, so as to impress a charge on capacitances that corresponds to the step offset (designated by a third code group) in the next segment (designated by the second code group), and then simultaneously connecting said one and other sides of said first and third capacitor means to said one side of said second capacitor means and said second bus line, respectively, for stabilizing charge on capacitances thereof; and (c) subsequently cyclically connecting both sides of said first and third capacitor means to ground and then connecting said one and other sides of said first and third capacitor means to said one side of said second capacitor means and said second bus line, respectively, for redistributing charge on the connected capacitances a number of times corresponding to segments that are above the prescribed segment specified by the second code group and containing the step offset defined by the third code group; said second switch means being operative for connections of one and other sides of said first and third capacitor means to the one side of said second capacitor means and the second bus line, respectively, that are associated with the first segment and with other segments, for connecting said second bus line to ground and to the other side of said second capacitor means, respectively; said first and third capacitor means transferring charge thereon to said second capacitor means during a connection of said second bus line that is associated with the first segment, and redistributing charge on said capacitor means for other connections.

DESCRIPTION OF DRAWINGS

FIG. 4 is a schematic logic and block diagram of the timing signal source 20.

FIG. 6 is a logic diagram of a non-overlap clock generator 83.

FIG. 7 is a schematic circuit and logic diagram of an embodiment providing a half step in the ± first segments that are adjacent the origin.

FIG. 8 is a schematic circuit diagram of an A-law PCM decoder embodying this invention.

FIG. 9 is a schematic circuit diagram of S19 in FIG. 8 and an associated timing circuit.

FIGS. 10 and 11 are schematic circuits for different embodiments for controlling the polarity of the output signal.

FIG. 12 is a schematic circuit diagram of an alternate embodiment of this invention for providing half step correction.

FIG. 13 is a schematic circuit diagram of S9 in FIG. 12 and an associated timing circuit 123.

DESCRIPTION OF PREFERRED EMBODIMENTS

Figure 1:
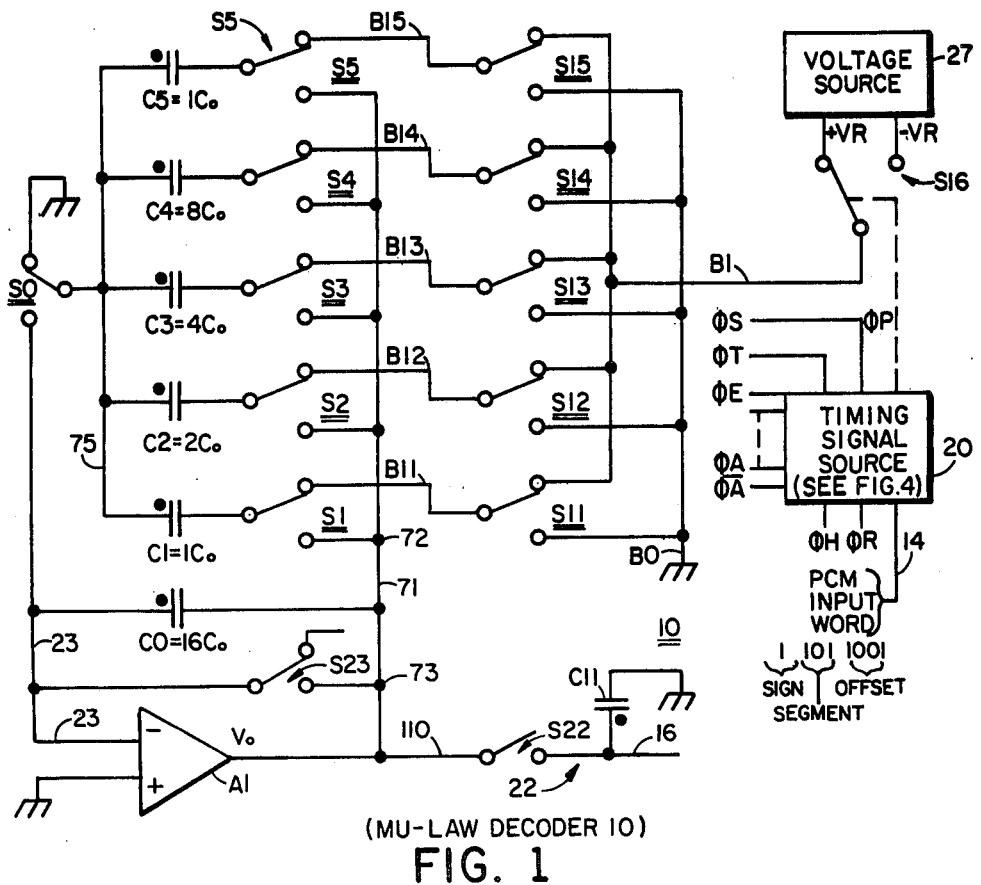
FIG. 1 is a circuit diagram of a mu-law decoder 10 embodying this invention with switches in schematic form.

In order to maintain an acceptable signal-to-noise ratio with a minimum number of bits in a code word representing a discrete analog signal amplitude, PCM systems use non-linear coding schemes in which the quantizing increment decreases as the analog signal level or amplitude decreases. Stated differently, of the total available number of quantized values representable with a given number of bits, a more than proportionate number of bits are allocated to the smaller signal amplitudes. The segmented mu-law is possibly the best known and most widely used coding scheme in the United States. In it, the amplitude range of sampled analog signals is divided into 16 segments, 8 segments for positive analog input signal voltages and 8 segments for negative analog input signals. Each segment contains 16 steps. In the lowest segments ± zero (that are adjacent the origin and designated by $S = \pm 0$), each step is a normalized unit value. In each successive segment, the step size or offset doubles: i.e., two units per step in segment one where $S=1$ (the binary name of the segement, rather than the position thereof with respect to the origin), four units per step in segment two, et cetera, to 128 units per step in segment seven where $S=7$ (the eighth segment from the origin). In order to reduce the quantizing noise for low level analog signals, the two steps adjacent to and symmetrical about the origin may be merged into a single step, with the origin at its midpoint. That is, the first steps in the segments ± zero are one-half unit high. The total number of normalized units that the magnitude of an analog signal sample is spaced from the origin is defined by $$(2^S)(16s) - 16 \quad (1)$$

where S is the numeral corresponding to the binary name for the segement and s is the step offset within a designated segment containing the analog signal sample. Since there is a total of 256 steps (or 255 steps when the two steps adjacent the origin are merged into a single step), the PCM code word defining the analog signal sample may be an 8-bit word consisting of three code groups. The first code group is the MSB of the PCM word and designates the polarity of the associated analog signal, being a binary one for positive voltages and a binary zero for negative signal voltages. The next three bits comprise a second code word which is a binary number indicating a particular segment containing the amplitude of an associated analog input signal, with 000 representing the segment closest to the origin and 111 representing the longest segment. The last four bits or LSB's comprise a third code group designating the step offset in the designated segment for the analog input signal sample, with 0000 being the first step and 1111 designating the last step in a particular segment. This companding and compression law coding format may be modified for transmission. This does not seriously change the codec transfer characteristic. The decoding characteristic is complementary to that of the encoding law described here. The segmented A-law coding scheme is more widely used in Europe. It is similar to the mu-law coding scheme except that the steps in the first two segments are of the same height, the step height doubling in each successive segment.

Referring now to FIG. 1, the mu-law PCM decoder 10 for converting an 8-bit PCM code word on line 14 to an associated analog signal sample on line 16 is preferably implemented in fully integrated circuit form. The PCM decoder 10 comprises a first integrated capacitor $C0 = 16Co$ that is connected across an operational amplifier A1 as a feedback capacitor, where Co is a normalized capacitance; a plurality of binary weighted switched capacitors $C1 = Co$, $C2 = 2Co$, $C3 = 4Co$, and $C4 = 8Co$; a second switched capacitor $C5 = Co$ having a normalized unit capacitance Co; pluralities of switch means S0-S5 and S11-S16 for causing the switched capacitors to periodically (a) sample voltages on associated ones of the bus lines B11-B15 and (b) redistribute charge on the switched capacitors and C0; a source 20 of timing control signals for driving the switch means; and a sample-hold circuit 22 including an integrated capacitor C11 which periodically samples and holds an analog output voltage Vo of A1. The switch means S16 is operative for connecting either a + or − reference voltage (±VR) to a bus line B1. Each of the switch means S11-S15 has two positions and is operative for connecting either the ground reference potential on bus line B0 or one of the positive and negative reference voltages (±VR) on line B1 to an associated one of the bus lines B11-B15. The switch means S0-S5 have two positions and are operative for causing the switched capacitors to alternately (1) sample the voltage on an associated one of the bus lines B11-B15 and (2) connect the switched capacitors simultaneously across C0 for redistributing charge on them. The switch S22 is periodically closed for sampling the analog output voltage Vo of the amplifier. The switch S23 is normally open; closing S23 short-circuits C0 for resetting the charge on it and the voltage Vo to zero. The dots adjacent one sides of the integrated capacitors in FIG. 1 designate the top plates thereof.

The amplifier A1 is preferably an integrated differential input operational amplifier associated with a feedback capacitor C0 so as to form a voltage controlled voltage source having a very low output impedance, a very high input impedance, and providing whatever output current is demanded by external circuitry. The amplifier preferably has a very large gain and an output voltage that is the gain times the difference between the two input voltages. The top and bottom plates of the integrating or feedback capacitor C0 are connected to the inverting input and output terminals, respectively, of A1. The non-inverting input of A1 is connected to ground for impressing a virtual ground potential on its inverting input line 23. Thus, the top plate parasitic capacitance of C0 does not change the output impedance of A1 or the operation of the decoder since A1's output impedance is already substantially zero ohms. Also, the bottom plate parasitic capacitance of C0 does not affect the operation of A1 or the decoder since it is effectively connected to ground. This means that the decoder is generally insensitive to both top and bottom plate parasitic capacitance effects of C0.

Figure 3:
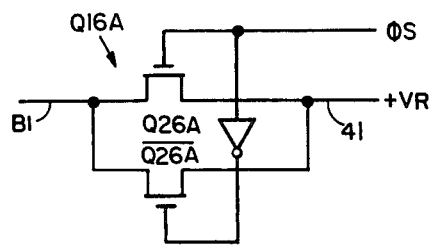
FIG. 3 is a schematric circuit diagram in which an FET of switch means S16 is implemented with a CMOS transfer gate.
Figure 2:
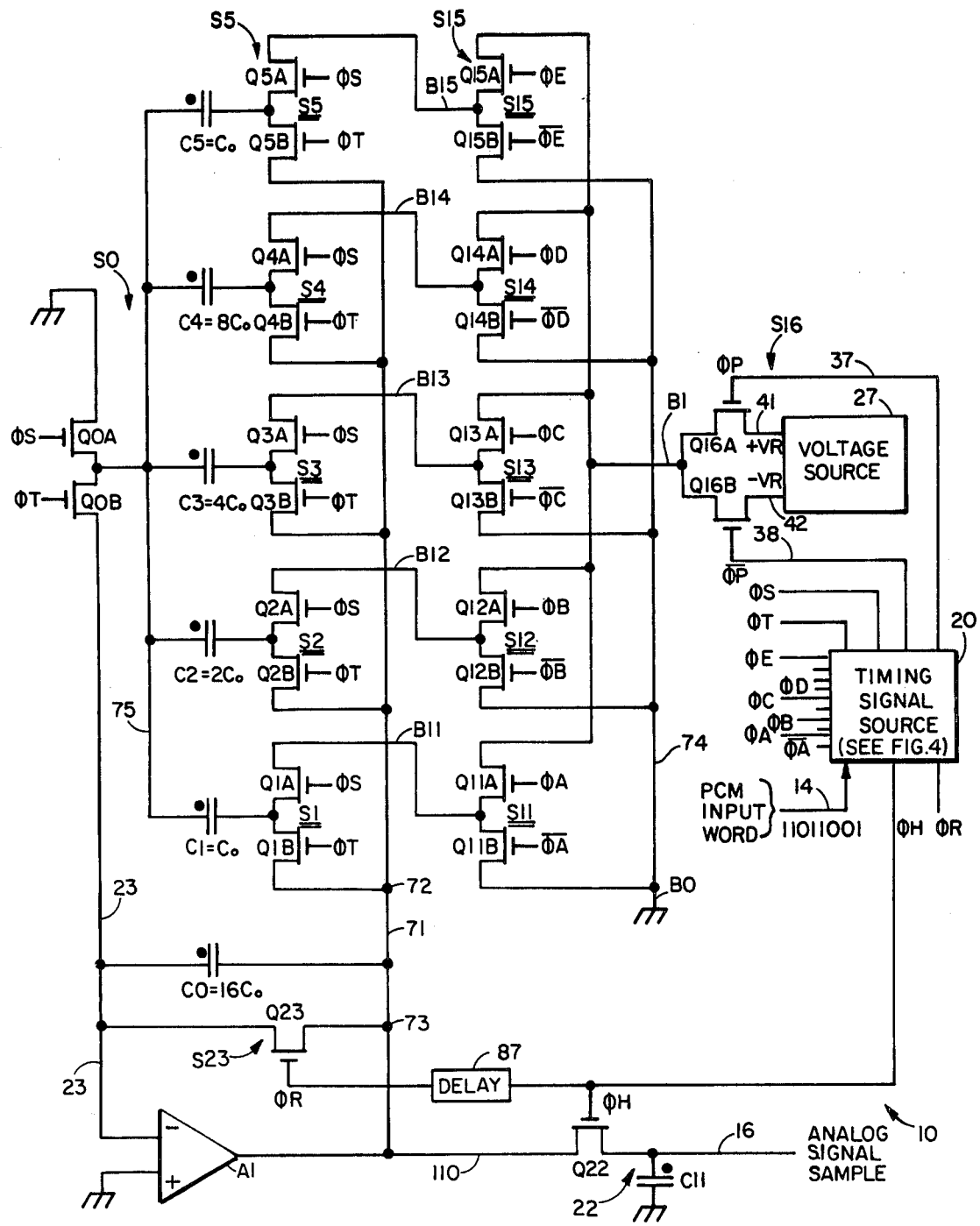
FIG. 2 is a schematic circuit diagram of the decoder 10 with switches thereof implemented with pairs of MOS FET's.

In an integrated circuit embodiment of the decoder 10 that is implemented with MOS technology, the switch means comprise MOS FET transistors, see FIG. 2. The switch means S16 in FIG. 2 comprises a pair of MOS FET transistors Q16A and Q16B that are connected in series across output terminals of a voltage source 27 with their intermediate terminals connected to the bus line B1. Their gate electrodes are driven by digital control signals $\emptyset P$ and $\overline{\emptyset P}$ from source 20 which set the polarity of the associated analog signal. Alternatively, each FET transistor in FIG. 2 may be replaced with a CMOS transfer gate as is Q16A in FIG. 3 for reducing feedthrough of control signals. The switch means S11-S15 also comprise pairs of series connected MOS FET transistors that are connected between the bus lines B0 and B1, their intermediate terminals being connected to associated bus lines B11-B15. Their gate electrodes are driven by associated ones of the digital control signals $\emptyset A$-$\emptyset E$ and the complements thereof, see FIG. 5. The switch means S0-S5 also comprise pairs of series connected MOS FET transistors having gate electrodes that are driven by different ones of a pair of two-phase non-overlapping digital timing control signals $\emptyset S$ and $\emptyset T$ in FIG. 5. Associated ones of the transistors Q1A-Q5A and Q1B-Q5B are connected in series between an associated one of the bus lines B11-B15 and the output terminal of A1. Since this circuit structure switches the bottom plates of C1-C5 and the source and drain electrodes of transistors of S1-S5 between output terminals of voltage sources A1 and 27 or between the output of voltage source A1 and ground, the decoder is substantially insensitive to parasitic and stray capacitance effects associated with these electrodes of these elements. The transistors Q0A and Q0B of switch means S0 are connected in series between ground and the line 23, which has a virtual ground potential impressed upon it by the operation of A1, with their intermediate terminals connected to the top plates of C1-C5. This structure requires that the top plates of C1-C5 and the drain and source electrodes of Q0A and Q0B be alternately connected to ground and the virtual ground potential on line 23 so that the decoder is also substantially insensitive to parasitic and stray capacitance effects associated with the electrodes of these elements.

The switch means S22 and S23 comprise associated MOS FET transistors having gate electrodes responsive to control signals $\emptyset H$ and $\emptyset R$ in FIG. 5 for periodically charging C11 to the output voltage of A1 and for subsequently resetting the charge on C0 to substantially zero, as is described more fully hereinafter. Since the source and drain electrodes of Q23 are connected to either the output of a voltage source A1 or a virtual ground potential on line 23, the operation of the decoder 10 is substantially insensitive to stray capacitance effects associated with this transistor. One of the source and drain electrodes of Q22 is also connected to the output of A1 so that it has no effect on the operation of the decoder. The other one of the Q22 source and drain electrodes is connected to the top plate of C11 so that any stray capacitance associated therewith is connected in shunt with this integrated capacitor and can then be compensated for by varying the capacitance of the latter. Also, the exact value of C11 is not critical. Thus, it is seen that the decoder 10 is substantially insensitive to parasitic and stray capacitance effects associated with plates of integrated capacitors and electrodes of switching transistors thereof.

The timing signal source 20 in FIG. 4 essentially comprises a register 29 which is parallel loaded with bits of the PCM code word on line 14, a clock generator 43 which drives a four bit counter 49, comparator means 56 which compares the binary number specified by the second code group with that defined by the three most significant bits w3w2w1 in the output of the counter 49, and pairs of series connected NOR-gates 60-69. The gates are responsive to outputs of the comparator 56 for selectively passing binary bits in the third code word on lines 30-33 only for a particular segment identified by the second code group. The various timing signal voltages produced by the source 20 are illustrated in waveforms in FIG. 5.

Figure 5:
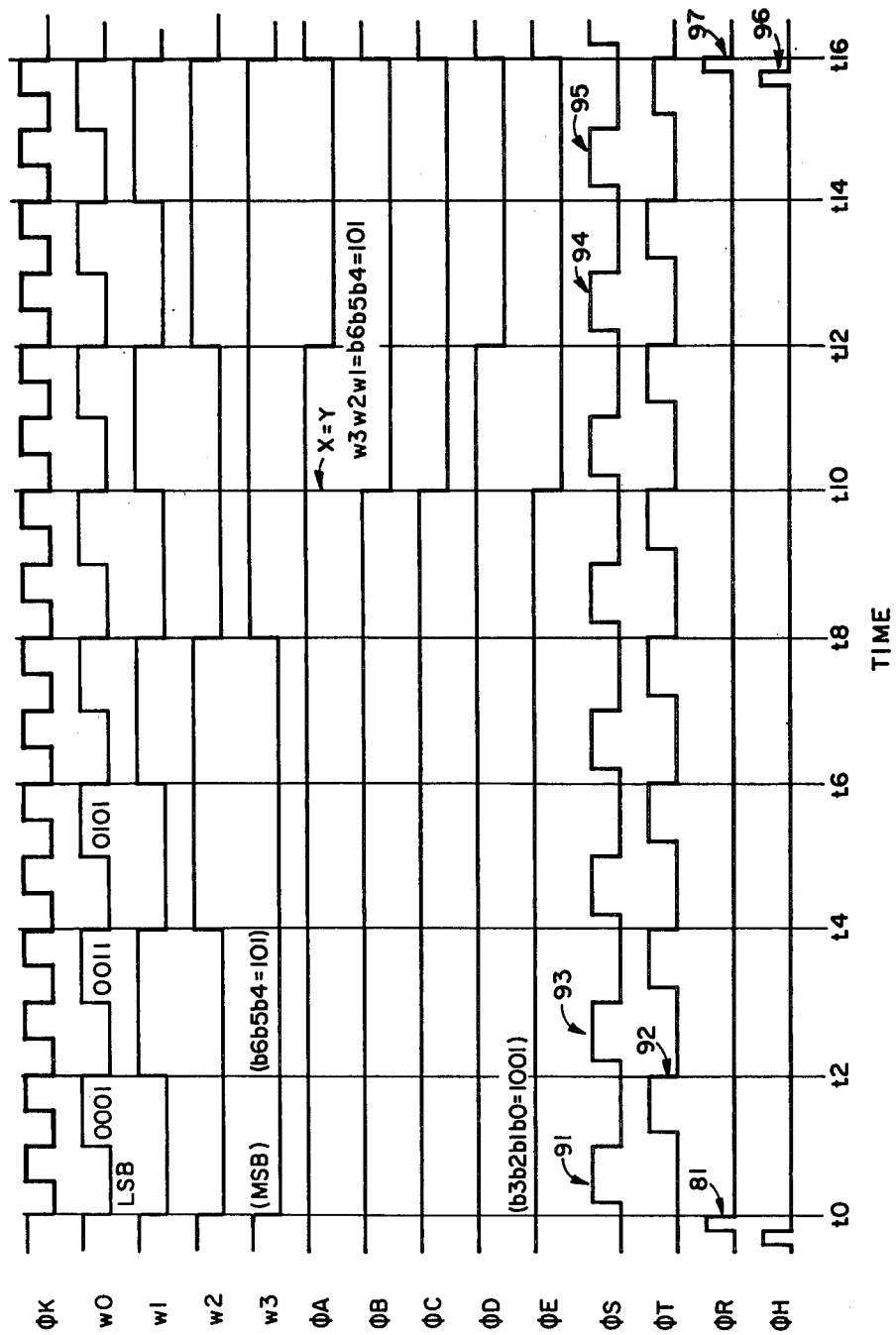
FIG. 5 is waveforms useful in describing the operation of this invention.

The register 29 holds the bits in the PCM code word constant during one complete conversion cycle, between times t0 and t16 in FIG. 5. The most significant or polarity bit on line 37 and the inverse thereof are buffered onto lines 39 and 40 as $\emptyset P$ and $\overline{\emptyset P}$ which drive Q16A and Q16B, respectively, for determining whether a positive or negative reference voltage ($+VR$) is produced on bus line B1. The next three most significant bits on output lines 36-34 of the shift register (comprising the second code group) are applied to inputs of the comparator 56 as a binary word Y=y2y1y0. The four least significant bits (the third code group) in the shift register are applied to inputs of associated NOR-gates 63-60.

The four bit counter 49 is responsive to the reset pulse 81 in $\emptyset R$ for resetting the contents thereof at time t0. The counter 49 is also responsive to negative going transitions in the clock signal $\emptyset K$ for incrementing the output thereof. The least significant bit in the output of the counter is applied to a non-overlap pulse generator 83 such as is illustrated in FIG. 6 for producing the sample and dump timing pulses in $\emptyset S$ and $\emptyset T$ that drive the switch means S0-S5. These control signals are coupled from the output terminals of NOR-gates in the circuit 83. An AND-gate 85 logically combines the output bits of the counter 49 for producing the signal $\emptyset H$ which drives Q22 of the sample-hold means. The signal $\emptyset H$ is delayed in a circuit element 87 for producing the reset signal $\emptyset R$ in FIG. 5.

The circuit 56 compares the binary numbers defined by the second code word Y=y2y1y0 and the word X=x2x1x0 that is defined by the three most significant bits w3w2w1 in the output of the counter 49 for producing binary signals on lines 57 and 58 indicating whether X<Y, X>Y, or X=Y. When X is less than Y, the comparator produces a binary 1 and 0 on lines 57 and 58 which disable the NOR-gates 60-64 for blocking passage of the third code group and impressing binary 1's onto the outputs of NOR-gates 65-69 which are connected through buffer amplifiers to Q11A-Q15A for tying all of the lines B11-B15 to bus line B1 and $\pm VR$. This causes capacitors C1-C5 to sample the voltage on B1 and redistribute the charge on C0-C5 during each time slot (such as between times t0 and t2 in FIG. 5) associated with a segment that is below the segment designated by the second code word and containing the associated analog signal. Conversely, when X is greater than Y, the converter produces a binary 0 and 1 on lines 57 and 58, the latter disabling NOR-gates 65-69 for producing binary zeros in control voltages $\emptyset A$-$\emptyset E$ for now tying all of the bus lines B11-B15 to ground. This connects both sides of the switched capacitors C1-C5 to ground during time slots such as between times t12-t14 when the output X=w3w2w1 of the counter designates a segment that is above the segment designated by the second code word. Only during the time slot where X=Y (i.e. between times t10 and t12 in FIG. 5) does the converter produce a binary zero on both of the lines 57 and 58 for enabling the NOR-gates 60-63 and 65-68 for passing bits of the digital word in the third code group and bit positions b3-b0 in the shift register in the timing control signals ØD-ØA. These binary zeros on lines 57 and 58 at time t10 also cause NOR-gate 69 to produce a binary zero in the control signal ØE. This means that the switches S11-S15 are driven such that a charge corresponding to the offset within a particular segment is impressed on the switched capacitors and redistributed only during the prescribed time interval between times t10 and t12 in FIG. 5 that is associated with the segment defined by the second code group and which contains the associated analog signal. As was stated previously, the counter 49 is reset and the next PCM code word entered into the shift register upon termination of the next reset pulse 97 in ØR.

The operation of the decoder 10 will now be considered for the PCM coded digital input word 11011001 on line 14 during the conversion cycle starting at time t0 in FIG. 5. Considering only the input word, the MSB indicates that the polarity of the associated analog signal is positive, whereas the third and second code groups 1001 and 101, respectively, indicate that the amplitude of the analog signal corresponds to that of the ninth step in the sixth segment (which is segment 5).

The reset pulse 81 in ØR turns on Q23 immediately prior to time t0 for short circuiting C0 and resetting the charge on it to substantially 0. The negative going edge of pulse 81 also resets the counter 49 for making all of the outputs thereof a binary 0. The one-bit shift register 29 is also responsive to the reset pulse 81 for parallel loading bits b0-b7 of the input word into associated stages thereof and holding them constant on associated output lines 30-37 throughout the conversion cycle between times t0 and t16. The sign bit b7=1 and the inverse thereof are buffered onto lines 39 and 40 for causing Q16A and Q16B to be conducting and non-conducting, respectively, for connecting the voltage +VR to line B1. The four least significant bits b0-b3 on lines 30-33 are coupled to one inputs of associated NOR-gates 60-63. Since the output word W=w3w2w1=x2x1x0 of the counter is 000 between times t0 and t2, such that X<Y=101, the outputs of the comparator on lines 57 and 58 are a binary 1 and 0 for disabling gates 60-64 for blocking the offset word b3-b0 from switching transistors. This operation also causes gates 65-69 to produce a binary 1 in the timing signals ØA-ØE at this time. These timing signals and the inverse thereof are buffered to transistors of S11-S15 for causing Q11A-Q15A to conduct for connecting the voltage +VR on line B1 to each of the bus lines B11-B15.

The sample pulse 91 in ØS in the time slot t0-t1 closes the upper contacts of S0-S5 (i.e. Q0A-Q5A) for connecting each of the switched capacitors C1-C5 between ground and the associated one of the bus lines B11-B15 so that they all sample the voltage +VR. The counter is responsive to the negative going transition in ØK at time t1 for causing only the LSB w0 in the output thereof to change logic levels. This terminates the sample pulse 91 and produces the positive pulse 92 in ØT which now closes the lower contacts of S0-S5 for simultaneously connecting C1-C5 in parallel with C0 for redistributing charge on them. The upper contacts of S0-S5 are again closed by the pulse 93 in ØS after time t2 for starting a new sample-redistribution cycle. The operation of the converter between times t0 and t2 impresses a charge on C0 that is associated with and corresponds to the amplitude of the first segment in the positive half of the mu-law characteristic. This operation is repeated during subsequent time slots until the time t10 when the decoder has cycled through the five time slots associated with the first five segments in the positive half of the mu-law characteristic. Consideration of this operation reveals that when S0-S5 cause associated capacitors to complete a charge sample-redistribution cycle, the previous charge voltage on C0 is divided by 2, and then ½ of the charge voltage on the sum of C1-C5 is added to it. Each time this charge-redistribution sequencing of S0-S5 is repeated, the previous charge on C0 is divided by 2. The quantity of charge transferred during each sample-redistribution cycle represents 16 steps of offset within a particular segment. In the example described so far, cycling or sequencing the switches S0-S5 for accomplishing five charge-redistribution cycles accumulates charge for five times 16 steps on C0, where each set of steps is twice the size of steps of the preceding segment because of the successive divisions by two. Thus, the voltage Vo on C0 is representable as $$V_o = \frac{\frac{VR/2 + VR}{2}}{2} + \ldots \qquad (2)$$

where the charge voltage on C0 is initially zero volts.

When the counter 49 is incremented at time t10, the output bit w1 thereof again goes high for making X=w3w2w1=101 designate the sixth segment (i.e., segment five) of the conversion characteristic. Since this makes X=Y, the comparator 56 outputs are now both 0 for enabling gates 60-69 and passing the offset word b3-b0=1001 in the timing signals ØD-ØA, respectively, see FIG. 5 at time t10. Since the output of gate 64 is now high, the output of gate 69 and ØE are a binary 0 at time t10. The transistors of S11-S15 are responsive to the timing signals ØA-ØE and the complements thereof for impressing +VR on lines B11 and B14, and impressing the ground reference voltage on lines B12, B13 and B15. This causes C1-C5 to sample a charge voltage that is directly proportional to the offset within the sixth segment and redistribute it on C0 during the time slot t10-t12.

During the next two time slots between t12 and t16, the output of counter 49 is incremented so that X>Y. This causes the comparator output on line 58 to be a binary 1 for disabling the gates 65-69 and producing a binary 0 in each of the timing signal voltages ØA-ØE. This holds Q11B-Q15B on for connecting the associated bus lines B11-B15 to ground. This means that sample pulses 94 and 95 in ØS connect both sides of C1-C5 to ground. The result is that cycling of S0-S5 during the last two time slots between t12 and t16 reduces the charge on C0 by a factor of 4 for producing a charge voltage on C0 and in the output of A1 that is the magnitude of the analog signal sample for the designated PCM coded input word on line 14. Transistor Q22 conducts in response to the timing pulse 96 in ØH for causing C11 to sample the analog voltage Vo in the output of the amplifier. The transistor Q23 is responsive to the reset pulse 97 in ØR for subsequently resetting the charge on C0 to 0 and entering the next PCM digital code word into stages of the shift register prior to resetting the counter 49 at time t16.

In summary, the decoding procedure for the circuit 10 in FIG. 1 is as follows: (1) reset the charge on C0 to 0 by closing and opening S23. (2) Establish a positive or negative reference votage ±VR on B1. (3) With B1 connected to B11-B15, toggle S0-S5 one less than the number of times designated by the binary value of the second code group. (4) With B15 connected to ground and B11-B14 connected to either B0 (ground) or B1 (VR) in the manner designated by bits of the third code group, with its MSB establishing the binary voltage on B14, toggle S0-S5 only once. (5) With B11-B15 all connected to ground, toggle S0-S5 a number of times corresponding to segments not previously considered and above that segment designated by the second code group.

In another decoder 10A (not shown) embodying this invention, the speed of the decoder is approximately doubled by increasing the speed of operation of the timing source 20 and generation of signals w0-w3 and $\emptyset$A-$\emptyset$E, and duplicating S0-S5 and C1-C5 with switches S0'-S5' of the opposite phase as S0-S5 and with the capacitors C1'-C5' of the same values as C1-C5. In this decoder, C1-C5 sample voltages on associated bus lines B11-B15 for a sample pulse 91, for example, in $\emptyset$S while the capacitors C1'-C5' are connected across C0 for redistributing charge on them. During the dump pulse 92 in $\emptyset$T in the next time slot t1-t2, the capacitors C1'-C5' sample the voltages on bus lines B11-B15 while C1-C5 are connected across C0 for redistributing the charge on them.

In another embodiment of this invention, the speed of decoding is increased by simultaneously operating on a number of segments at a time. A decoder 10B (not shown) for operating on segments in parts (i.e., two segments at a time) additionally comprises a second set of capacitors C1'-C5' and a second set of switches S0'-S5' and S11'-S15'. The capacitances of C1'-C5' here are twice the capacitances of associated elements C1-C5. In this decoder, the speed of the timing source 20 is increased and caused to produce a first set of timing voltages $\emptyset$A-$\emptyset$E for even numbered segments 0, 2, etc. and a second set of timing voltages $\emptyset$A'-$\emptyset$E' for odd numbered segments 1, 3, etc. During each cycle of adjacent pulses 91 and 92, for example, in $\emptyset$S and $\emptyset$D, S11-S15 and S11'-S15' are responsive to associated signals $\emptyset$A-$\emptyset$E and $\emptyset$A'-$\emptyset$E' for the least significant and most significant ones of a pair of segments (e.g. the odd and even numbered segments 0 and 1, respectively) for connecting binary voltages to associated bus lines. During a sample pulse 91, S0-S5 and S0'-S5' connect capacitors to associated bus lines for sampling voltages thereon. In the adjacent dump pulse 92 the switches simultaneously connect all of the switched capacitors C1-C5 and C1'-C5' across C0 for redistributing charge on C0 and capacitors of the two groups thereof. Alternatively, additional capacitor arrays for other segments or all eight segments may be employed, with the capacitances of associated capacitors in each additional array being doubled for the next higher segment. Further, the conversion speed may be made double that of the converter 10 with a single capacitor C12 (not shown) having a capacitance of 32Co, which is equal to the total capacitance of the aforementioned second binary weighted capacitor array C1'-C5', switches S0' and S1' associated with opposite sides of C12 and additional logic circuitry being required for causing C12 and the switches S0'-S1' to be associated with a full segment that does not include the step offset or end point of the associated analog signal. Alternatively, additional circuitry may be employed to reduce the capacitance of C12 an appropriate amount for an associated segment containing the end point of the analog signal voltage.

The decoder 10 implements a mu-law encoding characteristic in which there are 16 equal steps in each of the positive and negative segments that are adjacent the origin where Vo=0. In order to reduce quantizing noise and eliminate cyclical operation that may be caused by low level noise signals, it is desirable to have $15\frac{1}{2}$ steps in the first positive and negative segments rather than 16, the half steps being adjacent the origin. The decoder 10' in FIG. 7 accomplishes this half step spacing in the first segments by effectively dividing the unit valued capacitor C1=Co in FIG. 1 into a pair of equal valued capacitors C7=C8=Co/2. The capacitor C7 replaces C1 and is associated with S1 and S11, transistors of the latter being driven by the timing signals $\emptyset$A and $\overline{\emptyset A}$. The capacitor C8 is associated with S8 and S18, the latter being responsive to control voltages $\emptyset$F and $\overline{\emptyset F}$ for connecting bus line B18 to either ground or one of ±VR.

The timing signal $\emptyset$F is produced by a logic circuit 99 comprising a second counter circuit 100 producing binary control voltages V1 and V2 that are applied to inputs of associated series connected NOR-gates 101 and 102. The timing signal $\emptyset$A is applied to the other input of gate 101. The output of gate 102 is the timing signal $\emptyset$F which is buffered to the Q18A gate electrode. The counter 100 is reset by each pulse in $\emptyset$R for causing it to count negative transitions in $\emptyset$K for causing V1 and V2 to be either a binary 1 or 0 during the first time slot (t0-t2) associated with the first segment and strapping these control voltages to a binary 0 at all other times. This causes the connection of the bottom plate of C8 to either ground or ±VR to be controlled by the counter 100 and associated gates only during the time slot for the first segment, the timing voltage $\emptyset$F being the same as the control voltage $\emptyset$A during all other segments when V1=V2=0.

When V2 is a binary 1, then $\emptyset$F is a logic 0 for connecting both sides C8 to ground during the sample interval of the first time slot. This causes C0 to accumulate a charge in the time slot for the first segment, for a segment word 000 and an offset word 0001, that corresponds to one-half that of other steps in this first segment. Thus, there is a total of $15\frac{1}{2}$ steps in the first segment. Since V1 and V2 are both binary 0 in other time slots, all other segments have 16 steps. In an alternate embodiment in which V1 and V2 are a binary 1 and 0, respectively, $\emptyset$F is a binary 1 in the first segment for causing the origin, for second and third code words 000 and 0000, respectively, to be at $+\frac{1}{2}$ and $-\frac{1}{2}$ in the first segments. All other steps in the first segments then are unit valued such that there is a total of $16\frac{1}{2}$ steps in the first segments. When V1 and V2 are both a binary zero, then $\emptyset$F=$\emptyset$A.

In the modified form of this invention in FIG. 8 for satisfying the A-law characteristic, the decoder 10 of FIG. 1 additionally comprises a switch means S19 in line 71 for selectively connecting the node 72 to ground or to the bottom plate of C0 (i.e. to the output terminal of A1). The switch S19 is similar to the switches S11-S16 and comprises a pair of MOS FETs Q19A and Q19B that are connected in series between node 73 and ground, with their intermediate terminals connected to node 72. A logic circuit 74 in FIG. 9 produces timing signals ∅G and ∅G which are buffered to the gate electrodes of Q19A and Q19B. The logic circuit 74 comprises a counter circuit that is reset by pulses in ∅R and is responsive to the subsequent negative going transition in ∅K at time t1 for producing a positive pulse (a binary 1) in ∅G only during the time interval t1-t2. Alternatively, circuit 74 may be responsive to the reset pulse 81 for maintaining ∅G high throughout the time interval t0-t2. Alternatively, ∅G=W3, W2, W1. At other times, ∅G is low and ∅G is high. These timing signals therefore open Q19B and close Q19A during the time interval t1-t2 (or t0-t2) for connecting the binary weighted capacitors C1-C5 between the inverting input line 23 of A1 and ground during the charge stabilization pulse 92 in ∅T. This causes all of the charge on C1-C5 to be transferred to C0 during the first time slot t0-t2. At all other times during a conversion cycle, Q19B conducts and Q19A is cut off for connecting node 72 to the bottom plate of C0 so that C1-C5 redistribute charge on them and C0 during subsequent time slots. This operation essentially eliminates the numeral 2 in the first fraction at the left side of equation (2). This means that the full charge accumulated on C0 during the first segment is not reduced in magnitude by a factor of 2 as it was in the decoder 10 in FIG. 1. Thus, the steps in the first and second segments for the decoder 10″ in FIG. 8 are effectively the same height as is required by the A-law characteristic.

A preferred embodiment of an A-law decoder which is believed to satisfy the CCITT specifications and/or requirements for edge step correction (i.e., step size at segment edges) as specified in the article "A Unified Formulation of Segment Companding Laws and Synthesis of Codecs and Digital Compandors" by H. Kaneko, the BELL SYSTEM TECHNICAL JOURNAL (BSTJ), September 1970, pages 1555-1588, for the Decision Level Assignment or DLA approach where the edge parameter a is 0.5 is illustrated in FIGS. 12 and 13. As specified in Table 1 of this BSTJ article, the decoder output voltage step size at the edge points (i.e., the height of the riser for the last step in that segment) for a=½ is 50% larger than the size of other output voltage steps in that segment, except for the first segment. Considering normalized values of voltage steps and the height of the output voltage steps in the first and second segments being unity, then the height or size of the top step in the second segment is 1.5 units. Similarly, where the third segment contains 15 steps each having a height of 2 units, then the height or size of the last step in the third segment is 3 units. Stated differently, the decoder output voltage $Y_n=(X_{n-1}+X_n)/2$ for n=1, ..., 127,128, where $X_{n-1}$ and $X_n$ are adjacent decision values about which $Y_n$ is centered.

Referring now to FIG. 12, the only difference between A-law decoder 10″ in FIG. 8 and that in FIG. 12 is the inclusion of an additional capacitor C9 and associated switch S9 in FIG. 12. The capacitor C9 has a capacitance which is one half that of the unit size capacitor C1=1Co. The top and bottom plates of C9 are connected to the movable arms of switches S0 and S9, respectively. The upper and lower contacts of S9 are connected on lines 120 and 122 to the reference voltage and ground, respectively.

Boolean expressions for timing signals ∅I and ∅J for driving switch S9 are shown in FIG. 13, where individual terms thereof are available in FIG. 4 and ∅G=$\overline{w3}.\overline{w2}.\overline{w1}$. These logic expressions for ∅I and ∅J essentially require, for the prescribed segment being other than the first segment where L=0, that C9 be connected between ground and bus line B1 for being charged by the reference voltage during a sample pulse in ∅S and between the top plate of C0 and ground during a toggle pulses in ∅T for transferring all charge on C9 to the parallel connected capacitors C0 through C5 only during the prescribed segment. Both sides of C9 are preferably connected to ground or to ground and virtual ground during other segments so that C9 is effectively removed from the circuit at those times. This operation essentially adds an additional half of the current step size at the top of the lower of adjacent segments except for the first segment and the prescribed segment (i.e., not for the first and the prescribed segments) which equalizes the ramp and centers steps around the continuous values of the desired A-law curve.

If the first segment is the prescribed segment, then this operation of charging and discharging C9 is performed only in the second segment. Both sides of C9 are preferably connected to ground or to ground and virtual ground during other segments so that C9 is again removed from the circuit during these time intervals. The reason for operating on C9 differently when the prescribed segment is the first segment is that S19 still connects C1-C5 and C9 to ground during the first segment such that there is no charge on the capacitors C1-C5. Toggling S9 at this time (during the first or prescribed segment) would result in double the half step change in the output voltage, since all of the charge on C9 would be transferred to C0 rather than being transferred to the parallel combination of C0-C5 in accordance with the capacitances thereof. Consideration of the timing signals ∅I and ∅J confirms this operation. The first terms in ∅I cause charging of C9 during the sample pulse in ∅S when the circuit is currently operating in the prescribed segment ($\overline{∅58}.\overline{∅57}$) but is not in the first segment (∅G). The second term in ∅I causes charging of C9 when the prescribed segment is the first segment ($\overline{b6}.\overline{b5}.\overline{b4}$) and the current segment is the second segment ($\overline{w1}.\overline{w2}.\overline{w3}$). The first two terms in ∅J connect the bottom plate (line 121) of C9 to ground whenever the current segment is below and above the prescribed segment (∅57+∅58). In contrast, the third and fourth terms in ∅J cause connection of line 121 to ground only during toggle states in ∅T for the same conditions generally specified for the first and second terms in ∅I. The operation of the decoder 115 is the same as for decoder 10″ for other aspects of the circuit.

Figure 11:
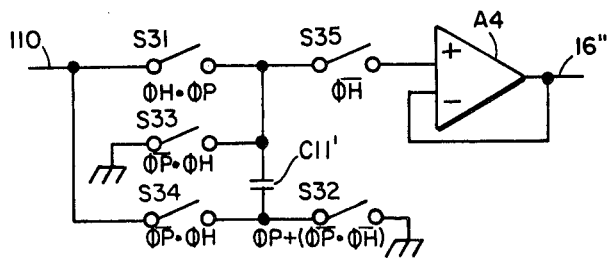

Although this invention is described in relation to preferred embodiments thereof, variations and modifications, will occur to those skilled in the art without departing from the spirit of this invention. By way of example, the amplifier A1 may be omitted and the top plates of C0-C5 on the left sides of FIGS. 1 and 2 connected to ground, although the resultant decoder is then sensitive to parasitic capacitance and stray capacitance effects associated with the capacitors and switching transistors. In such a decoder, voltage follower means is preferably employed in series in line 110 for buffering the output of the decoder to external circuitry. Also, the decoders may employ different types of sample-hold circuits. Additionally, the switch means may comprise other types of switching elements such as discrete transistors, mechanical switches, relays and other types of integrated switches. Also, the decoder may be realized in IC technologies other than MOS and CMOS, in other than fully integrated circuit form, and fully or partially implemented with discrete components. Further, additional structure may be associated with C0 and A1 for compensating for the error voltage introduced by the offset voltage of A1 when it is multiplied by the ratio of $A/(1+A)$, where A is the gain of A1 as is well known in the art. Additionally, individual switches may be employed for selectively connecting the bottom plates of C1-C5 to ground instead of common switch means S0 in FIGS. 1 and 2. And the code words can be other than binary words. Also, the ground reference voltage may be a reference voltage other than zero volts. Additionally, the bus line B1 may be tied directly to either line 41 or 42 in FIG. 2 and thus to the associated reference voltage ($\pm$VR). The polarity of the analog output signal sample on line 16 is then controlled by inverting and noninverting amplifiers A2 and A3 and transistors of a switch means S16' in FIG. 10 that are connected in associated series paths in line 16 for either inverting the sampled output voltage of A1 or passing it without inversion (see FIG. 10). Since the offset voltages introduced by A2 and A3 may not be the same magnitudes, however, care must be taken to compensate for them. Alternatively, apparatus for controlling the polarity of an analog output signal sample may be combined with a storage capacitor C11' as is illustrated in FIG. 11. Boolean expressions defining the control signals that drive different ones of the series switches S31-S32 and S33-S34 control sampling of $V_o$ by C11' when the sign bit is positive ($\emptyset p=1$) and negative, respectively, whereas S32 and S35 control connection of C11' to A4 in both instances. Also, the half step correction may be provided for only some segments which are below the prescribed segment by appropriately modifying the timing signals $\emptyset I$ and $\emptyset J$ in FIG. 13 so as to cause operation of S9 for a particular segment which is below the prescribed segment. Further, C9 may have a unit capacitance of C0 for causing the step size at the tops of adjacent segments to be 100% larger than it was in the associated lower order segment, so that the edge step is the same size as steps in the next higher order segment. This corresponds to the case where a=1 in the BSTJ article (infra). Additionally, both Q9A and Q9B may be cut off for leaving the bottom plate of C9 floating during operation in other than the prescribed segment and the second segment when the prescribed segment is the first segment. The scope of this invention is therefore to be determined from the appended claims rather than from the aforementioned detailed descriptions of preferred embodiments.

What is claimed is:

1. Apparatus for converting PCM coded digital input words into associated analog signals, each input word including first, second and third code groups of one or more bits defining the polarity, prescribed segment, and step offset in the prescribed segment for an associated analog signal sample, respectively, said apparatus comprising:

first capacitor means having one and other sides thereof and having a net normalized capacitance $C1=mCo$, where m is an integer and Co is a normalized capacitance;

second capacitor means having one and other sides thereof and having a capacitance $C2=nmCo$, that is an integral multiple of the principal number n of steps within each segment;

third capacitor means having pluralities of one and other sides thereof and having a total-net normalized capacitance which is substantially $Cs=nmCo-mCo=(n-1)mCo$;

first means for impressing one of a positive and negative prescribed reference voltage on a first bus line;

amplifier means having an input and an output terminal connected to one and other sides of said second capacitor means, said input terminal having a ground reference potential impressed thereon;

first switch means selectively operative for electrically connecting a second bus line to one of ground and said other side of said second capacitor means; and second switch means responsive to the second and third code groups (a) for cyclically connecting said one and other sides of said first and third capacitor means to ground and said first bus line, respectively, for charging the associated capacitances with the one prescribed reference voltage, and then connecting said one and other sides of said first and third capacitor means simultaneously to said one side of said second capacitor means and said second bus line, respectively, for stabilizing charge on said capacitances a number of times (which may be zero) associated with a segment that is designated by the second code group; (b) for subsequently first connecting one and other sides of said first and third capacitor means to ground and to ones of said first bus line and ground, respectively, so as to impress a charge on capacitances that corresponds to the step offset (designated by a third code group) in the prescribed segment (designated by the second code group), and then simultaneously connecting one and other sides of said first and third capacitor means to said one side of said second capacitor means and said second bus line, respectively, for stabilizing charge on capacitances thereof; and (c) subsequently cyclically connecting both sides of said first and third capacitor means to ground and then connecting one and other sides of said first and third capacitor means to said one side of said second capacitor means and said second bus line, respectively, for redistributing charge on the connected capacitances a number of times corresponding to segments that are above the prescribed segment specified by the second code group and containing the step offset defined by the third code group;

said first switch means being operative for connections of one and other sides of said first and third capacitor means to the one side of said second capacitor means and said second bus line, respectively, that are associated with a first segment and with other segments for connecting said second bus line to ground and to the other side of said second capacitor means, respectively; said first and third capacitor means transferring charge thereon to said second capacitor means during a connection of said second bus line that is associated with the first segment, and redistributing charge on said capacitor means for other connections of said second bus line.

2. Apparatus according to claim 1 wherein said second switch means connects both sides of said first capacitor means to ground during connections of sides of said third capacitor means for impressing a charge thereon corresponding to the step offset designated by the third code group at (b).

3. Apparatus according to claim 2 comprising sample-hold means periodically operative for sampling and holding the output voltage of said amplifier means for a charge voltage on said second capacitor means obtained from a stabilization of charge on said capacitor means for the last segment and defining the associated analog signal sample.

4. Apparatus according to claim 3 comprising third switch means responsive to the first code group designating the sign of the associated analog signal for controlling the sense of the analog output signal sample.

5. Apparatus according to claim 4 wherein said third switch means comprises said first means which is responsive to the first code group for impressing one of the positive and negative reference voltages on said first bus line for prescribing the sign of the associated output analog signal sample.

6. Apparatus according to claim 4 wherein said third switch means is responsive to the first code group for performing one of the functions of inverting the signal sample and passing without inversion the signal sample held by said sample-hold means for fixing the sign of the associated analog signal sample.

7. Apparatus according to claim 4 including fourth switch means operative subsequent to stabilizing charge on said capacitors for the last segment for resetting the charge voltage on said second capacitor means prior to receipt of the next PCM coded input word.

8. Apparatus according to claim 4 wherein said third capacitor means comprises a first plurality of binary weighted capacitor means each having one and other sides thereof and having normalized capacitances $2^i mC_o$, where $i=0, 1, 2$, etc.; said second switch means (a) cyclically connecting one and other sides of each of the plurality of binary weighted capacitor means and said first capacitor means to ground and said first bus line for sampling charge and simultaneously connecting the one and other sides of said plurality of capacitor means and said first capacitor means to said one side of said second capacitor means and said second bus line, respectively, for stabilizing charge on the capacitances a number of times associated with a segment that is designated by the second code group; (b) subsequently connecting both sides of said first capacitor means to ground while connecting one and other sides of said plurality of capacitor means to ground and to one of ground and the one prescribed reference voltage in a manner designated by binary bits in associated bit positions in the third code group for impressing a binary valued charge voltage on said first plurality of capacitor means corresponding to the step offset designated by the third code group, and then connecting the one and other sides of said first plurality of binary weighted capacitor means and said first capacitor means to the one side of said second capacitor means and said second bus line, respectively, for stabilizing charge on capacitances thereof; and (c) then cyclically connecting the one and other sides of said first plurality of capacitor means and said first capacitor means both to ground, and then to said one side of said second capacitor means and said second bus line, respectively, for stabilizing charge on capacitances thereof a number of times corresponding to the number of segments that are above that designated by the second code group.

9. Apparatus according to claim 8 wherein said third capacitor means comprises binary weighted capacitor means C11, C12, C13 and C14 having capacitances $mC_o$, $2mC_o$, $4mC_o$ and $8mC_o$, respectively.

10. Apparatus according to claim 8 wherein said amplifier means comprises differential input operational amplifier means having a non-inverting input electrically connected to ground for impressing a virtual ground potential on its inverting input terminal which is connected to said one side of said second capacitor means for causing them to operate as a voltage source; said prescribed voltage is an output voltage of a voltage source; and said capacitor means comprise integrated capacitors with their one and other sides being the top and bottom plates thereof.

11. Apparatus according to claim 8 wherein $m=1$; said third code group comprises a 4-bit binary word; said first capacitor means comprises a capacitor having a capacitance $C_o$; said second capacitor means comprises a capacitor having a capacitance $16C_o$; and said third capacitor means comprises four binary weighted capacitors having capacitances of $C_o$, $2C_o$, $4C_o$, and $8C_o$, where $C_o$ and $8C_o$ are associated with the LSB and MSB, respectively, of the third code group.

12. Apparatus according to claim 9 wherein said third code group comprises a 4-bit binary word; $m=2$ for causing said binary weighted capacitor means C11 that is associated with the LSB in the third code group to have a net normalized capacitance $C11=2C_o$; said capacitor means C11 comprises first and second capacitors each having one and other sides thereof and each having a capacitance $C_o$; said second switch means is operative for connecting one and other sides of said first capacitor in the same manner previously prescribed for binary weighted capacitor means of said third capacitor means; said second switch means is operative only for a first segment for an associated input word for connecting one and other sides of said second capacitor to ground and to one of ground and the one prescribed reference voltage for producing a half step adjacent the origin that is one-half the magnitude of other steps in the first segment; said second switch means connects said second capacitor in parallel with said first capacitor for operation associated with other segments.

13. Apparatus according to claim 9 further comprising fourth capacitor means $C4=2mC_o$ and fifth capacitor means comprising a second plurality of binary weighted capacitor means each having one and other sides thereof and having normalized capacitances $2mC_o$, $4mC_o$, $8mC_o$, and $16mC_o$, said second plurality of binary weighted capacitor means having a net capacitance of $Ct=2(n-1)mC_o$; said second switch means causing said first and third and said fourth and fifth capacitor means to simultaneously operate for charge associated with pairs of segments in the ascending order of the position thereof in the same manner as previously prescribed for said first and third capacitor means; said second switch means further causing said first and third capacitor means to be associated with charge for even-numbered segments 0, 2, 4, etc., and for causing said fourth and fifth capacitor means to be simultaneously associated with charge for odd-numbered segments 1, 3, 5, etc.

14. Apparatus according to claim 9 further comprising fourth capacitor means $C4=mC_o$ and fifth capacitor means which is a second plurality of binary-weighted capacitors also having capacitances $mC_o$, $2mC_o$, $4mC_o$, and $8mC_o$, and a net normalized capacitance which is substantially $(n-1)mC_o$; said second switch means causing said first and third capacitor means to be connected for sampling and stabilizing charge for one segment while it connects said fourth and fifth capacitor means for stabilizing and sampling charge, respectively, associated with an adjacent segment so as to cause said first and third capacitor means and said fourth and fifth capacitor means together to alternately operate for adjacent segments for increasing the conversion rate.

15. Apparatus according to claim 12 wherein said second switch means connects both one and other sides of said second capacitor to ground in the sampling interval of a first segment for an associated input word for producing a half step offset adjacent the origin.

16. The method of decoding PCM code words for producing associated analog signal samples; each word including first, second and third code groups of one or more bits each defining the polarity, prescribed segment and step offset within the prescribed segment, respectively, for an associated analog signal sample; comprising the steps of:

impressing one of a positive and negative prescribed reference voltage on a first bus line;

first connecting one and other sides of a first capacitor means to an input terminal and an output terminal of an amplifier means that has a virtual ground reference potential on said input terminal thereof; where the first capacitor means has a capacitance $C_1 = mnC_o$, where m is an integer, and $C_o$ is a normalized capacitance such that $C_1$ is an integral multiple of the principal number n of steps within each segment;

second cyclically connecting one and other sides of a second capacitor means having a net normalized capacitance $C_2 = mC_o$, and a third capacitor means, having a net normalized capacitance which is substantially $C_s = mnC_o - mC_o = (n-1)mC_o$, to a ground reference potential and the first bus line for charging the associated capacitances with one of the positive and negative prescribed reference voltages, and connecting one and other sides of said second and third capacitor means simultaneously to one side of said first capacitor means and to a second bus line, respectively, a number of times associated with a segment that is designated by the second code group;

third connecting the second bus line to ground for only the first segment for transferring charge on the second and third capacitor means to the first capacitor means, and to the other side of the first capacitor means for other segments for then redistributing charge on the capacitors;

fourth connecting both sides of the second capacitor means to ground and one and other sides of the third capacitor means to ground and ones of the first bus line and ground, respectively, so as to impress a charge on capacitances that corresponds to the step offset designated by the third code group for the prescribed segment designated by the second code group;

fifth connecting one and other sides of the second and third capacitor means to one side of the first capacitor means and the second bus line, respectively, for stablizing charge on capacitances thereof;

sixth cyclically connecting both one and other sides of the second and third capacitor means to ground and connecting them to the one side of the first capacitor means and to the second bus line, respectively, for redistributing charge on the connected capacitances a number of times corresponding to the segments that are above the one defined by the second code group and containing the step offset defined by the third code group; and perodically coupling an analog signal sample from the first capacitor means.

17. The method according to claim 16 including the additional step of causing the polarity of the analog signal coupled from the first capacitor means to have a polarity prescribed by the first code group.

18. The method according to claim 17 wherein the last named step comprises impressing one of a positive and negative reference voltage on the first bus line in accordance with the sign of the associated analog signal as designated by the first code group.

19. The method according to claim 17 wherein the last named step comprises performing one of the steps of inverting the periodically coupled analog signals and passing a noninverted coupled analog signal in accordance with the sign of the associated analog signal as designated by the first code group.

20. The method according to claim 17 wherein: the amplifier means is a differential input operational amplifier means; said first connecting step comprises connecting the non-inverting input terminal of the amplifier means to a ground reference potential for impressing a virtual ground on its inverting input terminal; and the ampliifer means and first capacitor means operate as a voltage source; and including the additional step of producing the prescribed voltages as output voltages of a voltage source.

21. The method according to claim 17 wherein the third capacitor means comprises a plurality of binary weighted capacitor means, each having one and other sides thereof and having normalized capacitances $mC_o$, $2mC_o$, $4mC_o$, and $8mC_o$, and having a total-net normalized capacitance that is substantially $C_s = nmC_o - mC_o = (n-1)mC_o$, said fourth connecting step comprising the step of seventh connecting one and other sides of the plurality of capacitor means to ground and to ones of ground and the one prescribed reference voltage in a manner designated by binary bits in associated bit positions of a binary word in the third code group for impressing a charge voltage on the plurality of capacitor means corresponding to the step offset designated by the third code group; and said fifth connecting step comprises eighth connecting the one and other sides of the plurality of binary weighted capacitor means and the second capacitor means to one side of the first capacitor means and to the second bus line, respectively, for stabilizing charge on capacitances thereof.

22. The method according to claim 17 wherein m=2 and the smallest binary weighted capacitor means having a capacitance $2C_o$ comprises first and second capacitors each having a capacitance $C_o$; and including the additional steps of ninth connecting one and other sides of the first capacitor in the same manner previously prescribed for binary weighted capacitor means; tenth connecting both sides of the second capacitor to ground in only a first segment for an associated input word for producing a half step adjacent the origin that is one-half the magnitude of other steps in the first segment; and eleventh connecting the second capacitor in parallel with the first capacitor for operation associated with other segments.

23. The method according to claim 21 including the additional step of resetting the charge on the first capacitor means subsequent to stabilizing the charge on the capacitors for the last segment and prior to receipt of the next PCM coded word.

24. The method according to claim 20 wherein the capacitor means comprise integrated capacitor means with their one and other sides being the top and bottom plates thereof for providing a method of decoding a PCM word into an associated analog signal sample which is substantially insensitive to parasitic and stray capacitance effects associated with integrated capacitors and transistor switch means thereof.

25. Apparatus according to claim 23 wherein said coupling step comprises sampling and holding the output voltage of the amplifier means for a charge on the capacitor means obtained from a stabilization of charge on the capacitor means for the most significant segment defining the associated signal sample prior to said step of resetting the charge on the first capacitor means.

26. Apparatus according to claim 1 further comprising fourth capacitor means having one and other sides thereof and having a net normalized capacitance $C4 = mCo/p$, where p is a positive non-zero number; said second switch means being operative during (b) above, when the prescribed segment is other than the first segment, for first connecting one and other sides of said fourth capacitor means to ground and said first bus line, respectively, for charging it with the prescribed reference voltage, and then connecting one and other sides of said fourth capacitor means to the one side of said second capacitor means and ground, respectively, for transferring all charge on said fourth capacitor means to the parallel combination of said other capacitor means.

27. Apparatus according to claim 26 wherein said second switch means is operative for only the second segment, when the prescribed segment is the first segment, for first connecting one and other sides of said fourth capacitor means to ground and said first bus line, respectively, for charging it with the prescribed reference voltage, and then connecting one and other sides of said fourth capacitor means to the one side of said second capacitor means and ground, respectively, for transferring all charge on said fourth capacitor means to the parallel combination of said other capacitor means.

28. Apparatus according to claim 27 wherein $p = 1$.

29. Apparatus according to claim 27 wherein $p = 2$.

30. Apparatus according to claim 27 wherein said second switch means essentially connects opposite sides of said fourth capacitor means to ground for the segments other than the one segment during which charge on it is transferred to the other capacitor means.

31. Apparatus according to claim 30 wherein said second switch means connects both sides of said first capacitor means to ground during connections of sides of said third capacitor means for impressing a charge thereon corresponding to the step offset designated by the third code group at (b).

32. Apparatus according to claim 31 comprising third switch means responsive to the first code group designating the sign of the associated analog signal for controlling the sense of the analog output signal sample.

33. The method according to claim 16 wherein said fourth connecting step further comprises, when the prescribed segment is other than the first segment, the step of connecting one and other sides of a fourth capacitor means having a capacitance $C4 = mCo/p$, where p is a positive non-zero number, to ground and the first bus line, respectively, for charging said fourth capacitor means with the prescribed reference voltage; and said fifth connecting step further comprises, when the prescribed segment is other than the first segment, connecting said one and other sides of said fourth capacitor means to the one side of said first capacitor means and ground, respectively, for transferring all charge on said fourth capacitor means to the parallel connected first, second and third capacitor means only during the prescribed segment.

34. The method according to claim 33 wherein said sixth connecting step further comprises, when the prescribed segment is the first segment, the step of connecting one and other sides of said fourth capacitor means to ground and the first bus line, respectively, for charging said fourth capacitor means with the prescribed reference voltage, and connecting said one and other sides of said fourth capacitor means to the one side of said first capacitor means and ground, respectively, for transferring all charge on said fourth capacitor means to the parallel connected first, second and third capacitor means only during the second segment.

35. The method according to claim 34 wherein $p = 1$.

36. The method according to claim 34 wherein $p = 2$.

37. The method according to claim 34 comprising the additional step of connecting opposite sides of said fourth capacitor means to a ground reference potential during segments other than the prescribed segment when the prescribed segment is other than the first segment.

38. The method according to claim 37 including the further step of connecting opposite sides of said fourth capacitor means to ground during segments other than the second segment when the prescribed segment is the first segment.

39. Apparatus for converting PCM coded digital input words into associated analog signal samples, each input word including first, second and third code groups of one or more bits defining the polarity, prescribed segment, and step offset in the prescribed segment for an associated analog signal sample, respectively, said apparatus comprising:

first capacitor means having one and other sides thereof and having a net normalized capacitance of $C1 = mCo$, where m in an integer and Co is a normalized capacitance;

second capacitor means having one and other sides thereof and having a capacitance $C2 = nmCo$, that is an integral multiple of the principal number n of steps within each segment;

third capacitor means having pluralities of one and other sides thereof and having a total-net normalized capacitance which is substantially $Cs = nmCo - mCo = (n-1)mCo$;

first means for impressing a prescribed reference voltage and ground on first and second bus lines;

amplifier means having an input and an output terminal thereof connected to one and other sides of said second capacitor means, said input terminal essentially having a ground reference potential impressed thereon; and first switch means responsive to the second and third code groups (a) for connecting said one and other sides of said first and third capacitor means to ground and said first bus line, respectively, for charging the associated capacitances with the reference voltage, and then connecting said one and other sides of said first and third capacitor means to said one side of said second capacitor means and ground, respectively, for transferring all charge on said first and third capacitor means to said second capacitor means for only a first segment which is not the prescribed segment; (b) for cyclically connecting said one and other sides of said first and third capacitor means to ground and said first bus line, respectively, for charging the associated capacitances with the reference voltage, and then connecting said one and other sides of said first and third capacitor means to associated sides of said second capacitor means for redistributing charge on said capacitances a prescribed number of times (which may be zero) associated with the prescribed segment; (c) for first connecting one and other sides of said first and third capacitor means to ground and to ones of said first and second bus lines, respectively, so as to impress a charge on capacitances that corresponds to the step offset in the prescribed segment, and then connecting one and other sides of said first and third capacitor means to associated sides of said second capacitor means for redistributing charge on capacitances thereof for the prescribed segment; and (d) subsequently cyclically connecting both sides of said first and third capacitor means to ground and then connecting one and other sides thereof to associated sides of said second capacitor means for redistributing charge on the connected capacitances a number of times corresponding to segments that are above the prescribed segment specified by the second code group and containing the step offset defined by the third code group.

40. Apparatus according to claim 39 wherein said first switch means connects both sides of said first capacitor means to ground during connections of sides of said third capacitor means for impressing a charge thereon corresponding to the step offset designated by the third code group at (c) above.

41. Apparatus according to claim 40 comprising sample-hold means periodically operative for sampling and holding the output voltage of said amplifier means for a charge voltage on said second capacitor means obtained from a stabilization of charge on said capacitor means for the last segment and defining the associated analog signal sample.

42. Apparatus according to claim 41 comprising second switch means responsive to the first code group designating the sign of the associated analog signal for controlling the sense of the analog output signal sample.

43. Apparatus according to claim 42 wherein said second switch means comprises said first means which is responsive to the first code group for impressing one of a positive and negative reference voltage on said first bus line for prescribing the sign of the associated output analog signal sample.

44. Apparatus according to claim 42 wherein said second switch means is responsive to the first code group for performing one of the functions of inverting the signal sample and passing without inversion the signal sample held by said sample-hold means for fixing the sign of the associated analog signal sample.

45. Apparatus according to claim 42 including third switch means operative subsequent to stabilizing charge on said capacitor means for the last segment for resetting the charge voltage on said second capacitor means prior to receipt of the next PCM coded input word.

46. Apparatus according to claim 39 further comprising fourth capacitor means having one and other sides thereof and having a net normalized capacitance $C4 = mCo/p$, where p is a positive non-zero number; said first switch means being operative during (c) above, when the prescribed segment is other than the first segment, for first connecting one and other sides of said fourth capacitor means to ground and said first bus line, respectively, for charging it with the prescribed reference voltage, and then connecting one and other sides of said fourth capacitor means to the one side of said second capacitor means and ground, respectively, for transferring all charge on said fourth capacitor means to the parallel combination of said other capacitor means.

47. Apparatus according to claim 46 wherein said first switch means is operative for only the second segment, when the prescribed segment is the first segment, for first connecting one and other sides of said fourth capacitor means to ground and said first bus line, respectively, for charging it with the prescribed reference voltage, and then connecting the one and other sides of said fourth capacitor means to the one side of said second capacitor means and ground, respectively, for transferring all charge on said fourth capacitor means to the parallel combination of said other capacitor means.

48. Apparatus according to claim 47 wherein $p=1$.

49. Apparatus according to claim 47 wherein $p=2$.

50. Apparatus according to claim 47 wherein said first switch means essentially connects opposite sides of said fourth capacitor means to ground for the segments other than the one segment during which charge on it is transferred to the other capacitor means.

51. Apparatus according to claim 50 wherein said first switch means connects both sides of said first capacitor means to ground during connections of sides of said third capacitor means for impressing a charge thereon corresponding to the step offset designated by the third code group at (b).

* * * * *